(12) United States Patent
Nagaoka et al.

(10) Patent No.: US 9,972,674 B2
(45) Date of Patent: May 15, 2018

(54) SCHOTTKY BARRIER DIODE AND MANUFACTURING METHOD THEREOF

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Tatsuji Nagaoka, Nagakute (JP); Hiroki Miyake, Toyota (JP); Shinichiro Miyahara, Nagoya (JP); Sachiko Aoi, Nagakute (JP)

(73) Assignees: TOYOTA JIDOSHA KABUSHIKI KAISHA, Toyota (JP); DENSO CORPORATION, Kariya (JP)

(*) Notice: Subject to any disclaimer, the term of this patent is extended or adjusted under 35 U.S.C. 154(b) by 0 days. days.

(21) Appl. No.: 15/519,701

(22) PCT Filed: Oct. 19, 2015

(86) PCT No.: PCT/JP2015/079479
§ 371 (c)(1),
(2) Date: Apr. 17, 2017

(87) PCT Pub. No.: WO2016/098438
PCT Pub. Date: Jun. 23, 2016

(65) Prior Publication Data
US 2017/0278923 A1 Sep. 28, 2017

(30) Foreign Application Priority Data
Dec. 17, 2014 (JP) .................. 2014-255287

(51) Int. Cl.
*H01L 29/872* (2006.01)
*H01L 29/06* (2006.01)
(Continued)

(52) U.S. Cl.
CPC ...... *H01L 29/0623* (2013.01); *H01L 21/0465* (2013.01); *H01L 21/761* (2013.01);
(Continued)

(58) Field of Classification Search
CPC ............. H01L 29/0623; H01L 29/1608; H01L 29/66212; H01L 29/7806; H01L 29/782; H01L 29/872
See application file for complete search history.

(56) References Cited

U.S. PATENT DOCUMENTS 9,385,182 B2 * 7/2016 Henning ............... H01L 29/872
9,773,923 B2 * 9/2017 Onozawa ............. H01L 29/872
(Continued)

FOREIGN PATENT DOCUMENTS

JP 2009-094433 A 4/2009
JP 2010-074058 A 4/2010
(Continued)

*Primary Examiner* — Cuong Q Nguyen
(74) *Attorney, Agent, or Firm* — Oliff PLC

(57) ABSTRACT

A technique stabilizing properties of SBDs is provided. An SBD is provided with a p-type contact region in contact with an anode electrode, and an n-type drift region in Schottky contact with the anode electrode. The p-type contact region includes a first p-type region having a corner portion, a second p-type region connected to the corner portion, and an edge filling portion located at a connection between the first p-type region and the second p-type region. First and second extended lines intersect at an acute angle, where the first extended line is a line extended from a contour of the first p-type region toward the connection and the second extended line is a line extended from a contour of the second p-type region toward the connection. An acute angle edge formed between the first extended line and the second extended line is filled with the edge filling portion.

4 Claims, 6 Drawing Sheets

(51) Int. Cl.
*H01L 29/16* (2006.01)
*H01L 21/761* (2006.01)
*H01L 21/04* (2006.01)
*H01L 29/66* (2006.01)

(52) U.S. Cl.
CPC ...... *H01L 29/1608* (2013.01); *H01L 29/6606* (2013.01); *H01L 29/872* (2013.01)

(56) References Cited

U.S. PATENT DOCUMENTS

| | | | |
|---|---|---|---|
| 9,825,163 B2* | 11/2017 | Tamaki | H01L 29/7811 |
| 2014/0130949 A1 | 5/2014 | Maehara | |
| 2014/0346522 A1* | 11/2014 | Disney | H01L 29/8611 257/76 |
| 2015/0333190 A1 | 11/2015 | Aketa et al. | |

FOREIGN PATENT DOCUMENTS

| | | |
|---|---|---|
| JP | 2014-094683 A | 5/2014 |
| JP | 2014-116471 A | 6/2014 |

* cited by examiner

SCHOTTKY BARRIER DIODE AND MANUFACTURING METHOD THEREOF

TECHNICAL FIELD

The technique disclosed herein relates to a Schottky barrier diode and a manufacturing method thereof.

BACKGROUND ART

Patent Literature 1 discloses a Schottky barrier diode (Schottky Barrier Diode: hereinbelow referred to as SBD). The SBD includes a semiconductor substrate, and an anode electrode in contact with the semiconductor substrate. The semiconductor substrate includes a p-type contact region that is in contact with the anode electrode, and an n-type drift region that is in Schottky contact with the anode electrode in a range where the p-type contact region is not provided. The p-type contact region includes a ring-shaped region, and a plurality of stripe-patterned regions provided on an inner peripheral side of the ring-shaped region. Each of the stripe-patterned regions is connected to the ring-shaped region. When a forward voltage is applied to the SBD, electrons flow from the n-type drift region to the anode electrode through a Schottky interface between the anode electrode and the n-type drift region. Due to this, the SBD turns on. Further, when a reverse voltage is applied to the SBD, the aforementioned flow of electrons stops, and the SBD turns off. Further, when the SBD is turned off, a depletion layer spreads from the p-type contact region to the n-type drift region located therearound. Since the depletion layer spreads to cover the Schottky interface, a high electric field is suppressed from being generated in a vicinity of the Schottky interface.

CITATION LIST

Patent Literature

Patent Literature 1:
Japanese Patent Application Publication No. 2009-94433

SUMMARY OF INVENTION

Technical Problem

In the SBD of Patent Literature 1, the ring-shaped region extends in an arc shape at each of its corner portions. Some of the stripe-patterned regions are connected to the corner portions of the ring-shaped region. Those stripe-patterned regions are connected at an acute angle to the corner portions of the ring-shaped region. That is, contours of the corner portions intersect at an acute angle with contours of the stripe-patterned regions. When this acute angle is too small, it becomes difficult to stably process such an acute angle pattern. Due to this, a shape of the p-type contact region cannot be produced stably upon mass production of SBDs, and there is a problem that differences in electric properties among the mass-produced SBDs become large. Notably, the SBD of Patent Literature 1 is a type of SBD in which holes do not flow into the n-type drift region from the p-type contact region upon when it is turned on. This type of SBD is called JBSD (Junction Barrier Schottky Diode). On the other hand, there also is a type of SBD in which holes flow into the n-type drift region from the p-type contact region (that is, a type in which both electrons and holes contribute to current) upon when it is turned on. This type of SBD is called MPSD (Merged PIN Schottky Diode). The MPSD may in some cases have a p-type contact region arranged similar to the JBSD. Thus, a similar problem as that of the JBSD occurs in MPSD as well. Thus, in this description, a technique that enables SBD properties to become stable upon mass production of SBDs, each of which has a p-type contact region and an n-type drift region at a contact surface between a semiconductor substrate and an anode electrode, is provided.

Solution to Problem

A Schottky barrier diode disclosed herein may comprise: a semiconductor substrate; and an anode electrode being in contact with a surface of the semiconductor substrate. The semiconductor substrate comprises: a p-type contact region being in contact with the anode electrode; and an n-type drift region being in Schottky contact with the anode electrode. The p-type contact region comprises a first p-type region, a second p-type region, and an edge filling portion. The first p-type region constitutes a closed loop at a contact surface between the anode electrode and the semiconductor substrate and includes a corner portion having a curved shape. The second p-type region is located on an inner peripheral side of the first p-type region at the contact surface and is connected to the corner portion. The edge filling portion is in contact with the first p-type region and the second p-type region at a connection between the first p-type region and the second p-type region. A first extended line and a second extended line intersect at an acute angle, where the first extended line is a line extended from a contour of the first p-type region toward the connection, the contour of the first p-type region extends in a range not being in contact with the edge filling portion, the second extended line is a line extended from a contour of the second p-type region toward the connection, and the contour of the second p-type region extends in a range not being in contact with the edge filling portion. An acute angle edge formed between the first extended line and the second extended line is filled with the edge filling portion.

In this SBD, the second p-type region is connected to the corner portion of the first p-type region. Although the first extended line of the contour of the first p-type region and the second extended line of the contour of the second p-type region intersect at an acute angle, the edge filling portion, which is a p-type region, is filled within this acute-angle edge. As above, due to the acute-angle edge being filled with the edge filling portion, a contour of the p-type contact region can be prevented from exhibiting a sharp-angle bend at the connection. Due to this, differences in electric properties among mass-produced SBDs can be suppressed in SBD mass production.

The present teachings may further provide a method of manufacturing a Schottky barrier diode. The method may comprises: forming a mask; forming a p-type contact region; removing the mask; and forming an anode electrode. In the forming of a mask, the mask including an opening is formed on a surface of an n-type semiconductor substrate, and the opening including features: (a) the opening includes a first opening, a second opening, and a third opening, the first opening constitutes a closed loop and includes a corner portion having a curved shape, the second opening is located on an inner peripheral side of the first opening and connected to the corner portion, and the third opening is formed at a connection between the first opening and the second opening; (b) a first extended line and a second extended line intersect at an acute angle, where the first extended line is a line extended from a contour of the first opening toward the connection, the contour of the first opening extends in a range not being in contact with the third opening, the second extended line is a line extended from a contour of the second opening toward the connection, and the contour of the second opening extends in a range not being in contact with the third opening; and (c) the third opening is formed in a range including an acute angle edge formed between the first extended line and the second extended line. In the forming of a p-type contact region, a p-type contact region is formed in the semiconductor substrate by implanting p-type impurities to the semiconductor substrate via the mask. In the removing of the mask, the mask is removed from the surface. In the forming of an anode electrode, an anode electrode is formed on the surface, the anode electrode being in contact with the p-type contact region and in Schottky contact with an n-type region in a range which was covered with the mask.

According to this method, the differences in the electric properties among the mass-produced SBDs can be suppressed.

DESCRIPTION OF EMBODIMENT

Embodiment

Figure 1:
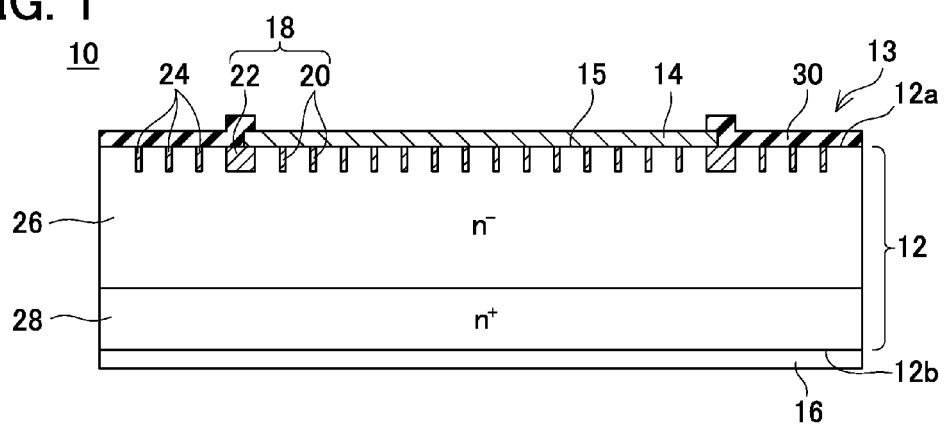
FIG. 1 is a vertical cross sectional view of an SBD 10 (vertical cross sectional view along a line I-I in FIG. 2)
Figure 2:
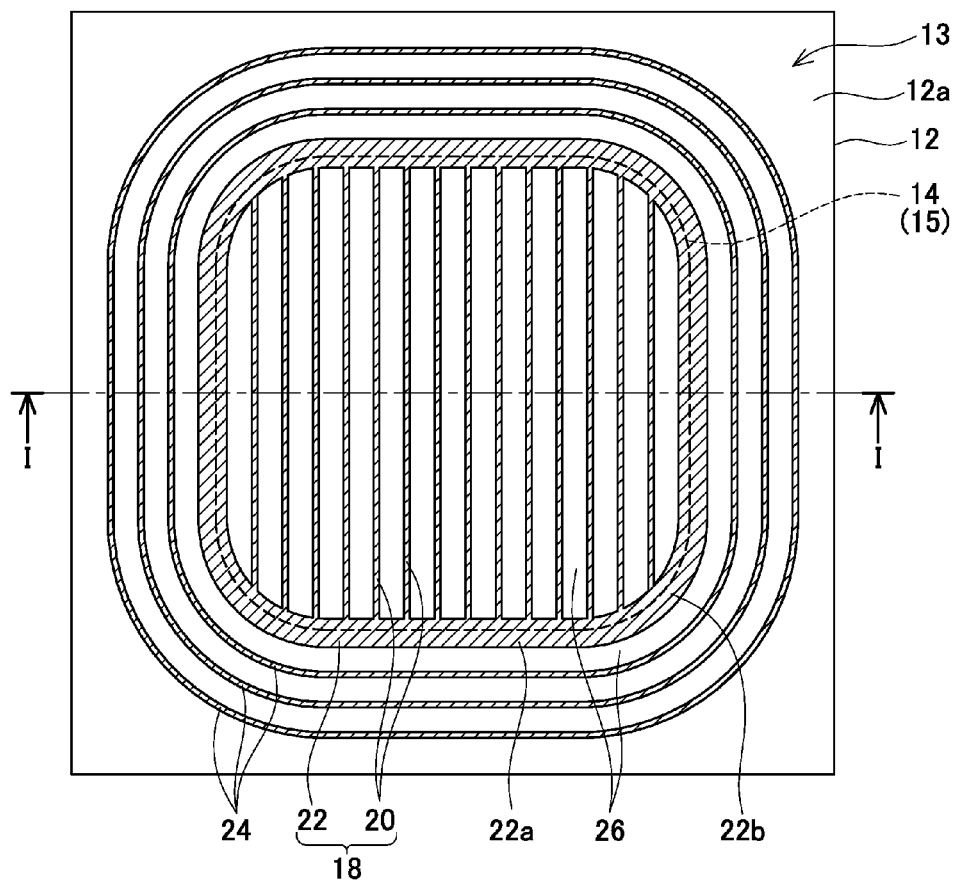
FIG. 2 is a top view of a semiconductor substrate 12.

An SBD 10 of an embodiment shown in FIGS. 1 and 2 comprises a semiconductor substrate 12. It should be noted that, in FIG. 2, p-type regions are shown by oblique line-hatching. The semiconductor substrate 12 is constituted of SiC. An anode electrode 14 and an insulating film 30 are provided on an upper surface 12a of the semiconductor substrate 12. A dotted line 14 in FIG. 2 shows a range in which the anode electrode 14 is provided (that is, a contact surface 15 where the semiconductor substrate 12 and the anode electrode 14 are in contact). The anode electrode 14 is provided at a center portion of the upper surface 12a of the semiconductor substrate 12. The upper surface 12a in a range that is not covered by the anode electrode 14 (hereinbelow referred to as a peripheral region 13) is covered by the insulating film 30. A cathode electrode 16 is provided on a lower surface 12b of the semiconductor substrate 12.

A p-type contact region 18, FLRs 24, a drift region 26, and a cathode region 28 are provided inside the semiconductor substrate 12.

The p-type contact region 18 is provided in a range exposed on the upper surface 12a of the semiconductor substrate 12. The p-type contact region 18 is provided only in a surface layer portion in a vicinity of the upper surface 12a of the semiconductor substrate 12. The p-type contact region 18 is in Schottky contact with the anode electrode 14.

The p-type contact region 18 comprises stripe-patterned p-type contact regions 20 and a ring-shaped p-type contact region 22.

As shown in FIG. 2, the ring-shaped p-type contact region 22 extends in a ring shape along an outer peripheral edge of the anode electrode 14. The ring-shaped p-type contact region 22 constitutes a closed loop in the contact surface 15. The ring-shaped p-type contact region 22 has a four-cornered shape, with each corner rounded into an arch shape. The ring-shaped p-type contact region 22 comprises linear portions 22a extending straight, and corner portions 22b extending in the arch shape. A width of the ring-shaped p-type contact region 22 is substantially constant regardless of its positions. The ring-shaped p-type contact region 22 has an inner peripheral side of its width located within the contact surface 15, and an outer peripheral side of its width located outside the contact surface 15. The ring-shaped p-type contact region 22 is in Schottky contact with the anode electrode 14 at its portion within the contact surface 15.

Figure 3:
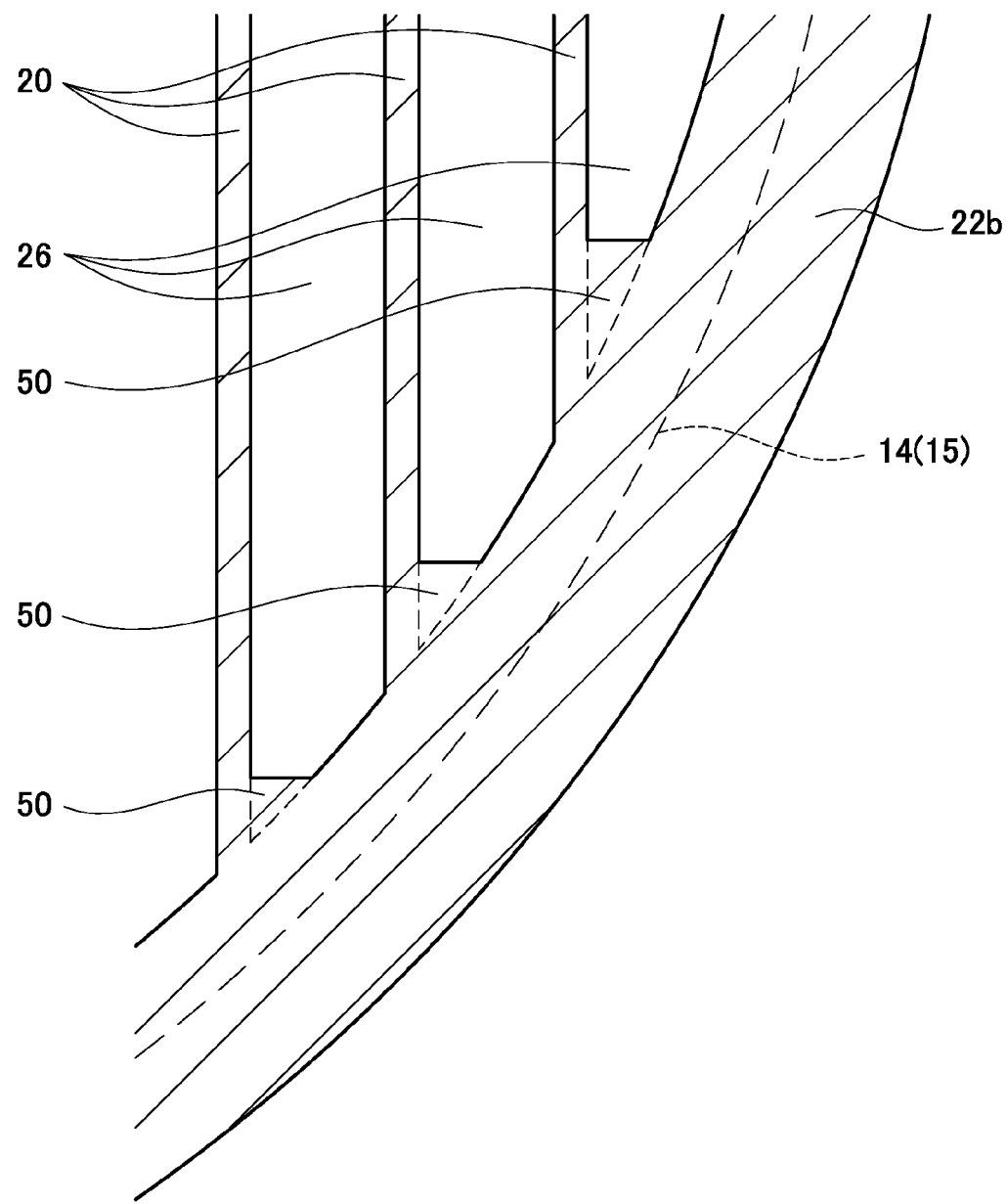
FIG. 3 is an enlarged view of a corner portion 22b.

The stripe-patterned p-type contact regions 20 are provided in plurality in the contact surface 15. The stripe-patterned p-type contact regions 20 are in Schottky contact with the anode electrode 14. The stripe-patterned p-type contact regions 20 are provided on an inner peripheral side of the ring-shaped p-type contact region 22. Each of the stripe-patterned p-type contact regions 20 extends straight and parallel to each other. The stripe-patterned p-type contact regions 20 are connected to the ring-shaped p-type contact region 22 at their both ends. Many of the stripe-patterned p-type contact regions 20 are connected to the linear portions 22a of the ring-shaped p-type contact region 22. Some of the stripe-patterned p-type contact regions 20 are connected to the corner portions 22b of the ring-shaped p-type contact region 22. It should be noted that, in FIGS. 1 and 2, a number of the stripe-patterned p-type contact regions 20 is indicated in a smaller number than their actual number, for easy view of the drawings. In actual implementation, the stripe-patterned p-type contact regions 20 are provided in a greater number on the inner peripheral side of the ring-shaped p-type contact region 22 at narrower intervals. Thus, as shown in FIG. 3, each corner portion 22b has a large number of stripe-patterned p-type contact regions 20 connected thereto.

The FLRs 24 are p-type semiconductor regions. The FLRs 24 are provided in a range exposed on the upper surface 12a of the semiconductor substrate 12. The FLRs 24 are provided only in the surface layer portion in the vicinity of the upper surface 12a of the semiconductor substrate 12. The FLRs 24 are provided in plurality in an outer peripheral portion of the contact surface 15 (that is, in the peripheral region 13). Each of the FLRs 24 extends in a ring shape so as to surround the anode electrode 14. The plurality of FLRs 24 is located with intervals in between them from an outer peripheral side to an inner peripheral side. Upper surfaces of the FLRs 24 are covered by the insulating film 30.

The drift region 26 is an n-type semiconductor region. The drift region 26 is provided under the stripe-patterned p-type contact regions 20, the ring-shaped p-type contact region 22, and the FLRs 24. Further, the drift region 26 extends to the upper surface 12a of the semiconductor substrate 12 (that is, the contact surface 15) at positions where the stripe-patterned p-type contact regions 20 and the ring-shaped p-type contact region 22 are not provided, and is in Schottky contact with the anode electrode 14. Further, in the peripheral region 13, the drill region 26 extends to the upper surface 12a of the semiconductor substrate 12 at positions where the FLRs 24 are not provided. As aforementioned, the stripe-patterned p-type contact regions 20 and the ring-shaped p-type contact region 22 are connected. Thus, the drift region 26 is provided in respective regions that are between the p-type regions 20, 22, and 24, except where connections of the p-type regions 20 and 22 are located. The drift region 26 separates the ring-shaped p-type contact region 22 from the FLRs 24. Further, the drift region 26 separates the FLRs 24 from each other.

The cathode region 28 is an n-type semiconductor region. The cathode region 28 has a higher n-type impurity concentration than an n-type impurity concentration of the drift region 26. The cathode region 28 is provided under the drift region 26. The cathode region 28 is provided in a range exposed on the lower surface 12b of the semiconductor substrate 12. The cathode region 28 is in ohmic contact with the cathode electrode 16. The cathode region 28 is separated from the stripe-patterned p-type contact regions 20, the ring-shaped p-type contact region 22, and the FLRs 24 by the drift region 26.

Figure 4:
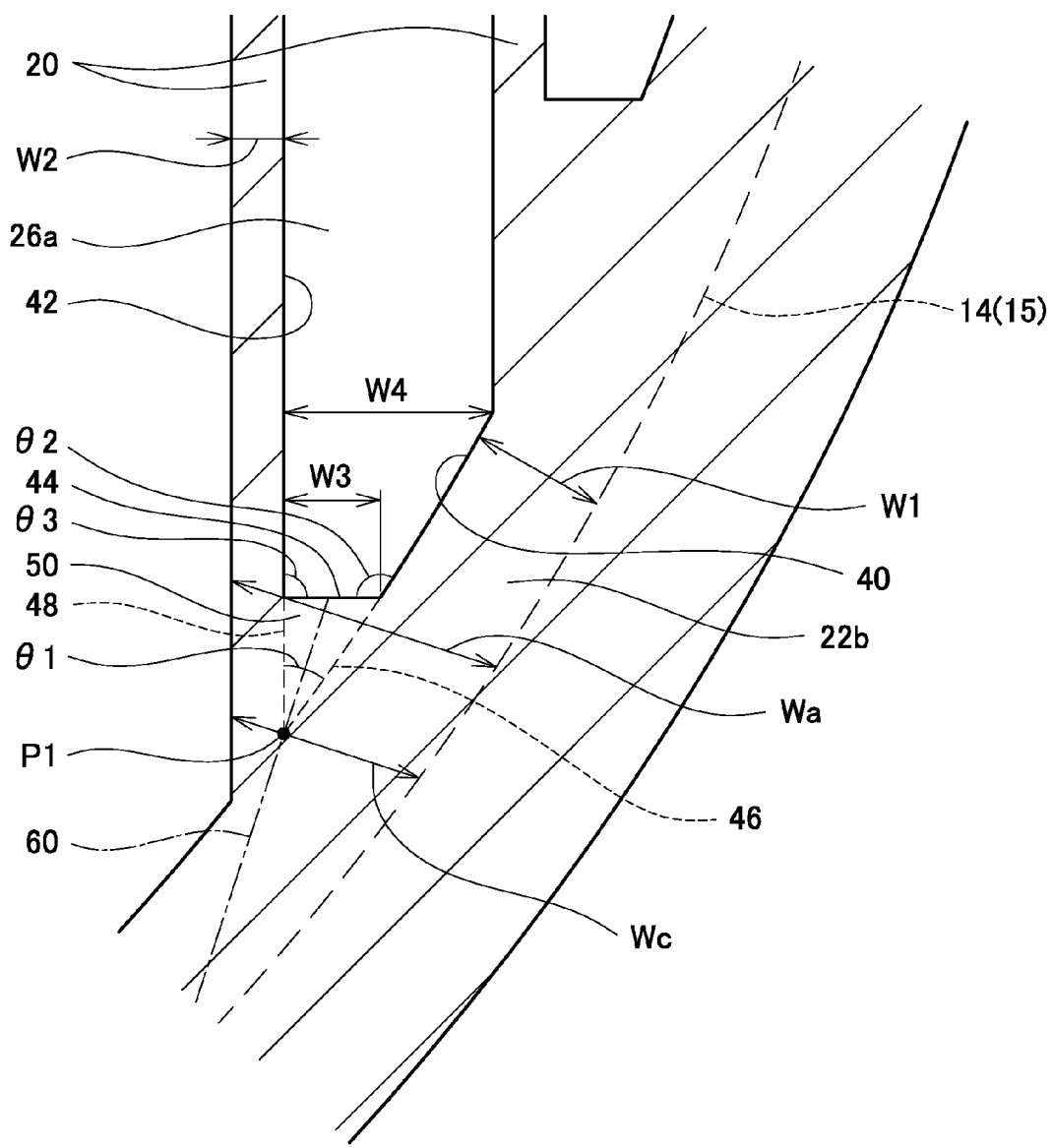
FIG. 4 is an enlarged view of the corner portion 22b.

Next, the connections of the stripe-patterned p-type contact regions 20 and the corner portions 22b of the ring-shaped p-type contact region 22 will be described in further detail. As shown in FIG. 4, the stripe-patterned p-type contact regions 20 and the corner portion 22b are connected at the contact surface 15. The drift region 26 is present between the stripe-patterned p-type contact regions 20 and the corner portion 22b. Hereinbelow, the drift region 26 located between the stripe-patterned p-type contact regions 20 and the corner portion 22b will be termed a drift region 26a. An edge filling portion 50 is provided at each of connections between the respective stripe-patterned p-type contact regions 20 and the corner portion 22b. Each edge filling portion 50 is a part of the p-type contact region 18. Each edge filling portion 50 is located between the corner portion 22b and the corresponding one of the stripe-patterned p-type contact regions 20. Each edge filling portion 50 is adjacent to the corner portion 22b, the corresponding stripe-patterned p-type contact region 20, and the drift region 26a. A reference number 40 in FIG. 4 shows a contour 40 of the corner portion 22b at the contact surface 15 (that is, a boundary between the corner portion 22b and the drift region 26a). The contour 40 is a contour of the corner portion 22b at a position where it is not in contact with the edge filling portion 50. A reference number 42 in FIG. 4 shows a contour 42 of the stripe-patterned p-type contact region 20 at the contact surface 15 (that is, a boundary between the stripe-patterned p-type contact region 20 and the drift region 26a). The contour 42 is a contour of the stripe-patterned p-type contact region 20 at a position where it is not in contact with the edge filling portion 50. A reference number 46 in FIG. 4 shows an extended line 46 extended from the contour 40 toward a connection side. A reference number 48 in FIG. 4 shows an extended line 48 extended from the contour 42 toward the connection side. The extended line 46 and the extended line 48 intersect at an intersection P1 by an acute angle θ1. More specifically, the acute angle θ1 is an angle that is equal to or less than 45°. That is, an acute-angle edge having the acute angle θ1 is provided between the extended line 46 and the extended line 48. The edge filling portion 50 is provided so as to fill the acute-angle edge. Due to this, all of the intersections P1, the extended lines 46, and the extended lines 48 are present within the p-type contact region 18. A reference number 44 in FIG. 4 shows a contour 44 of the edge filling portion at the contact surface 15 (that is, a boundary between the edge filling portion 50 and the drift region 26a). The contour 44 extends substantially straight in a direction that intersects orthogonally to the stripe-patterned p-type contact region 20. The contour 44 is connected to the contour 40 and the contour 42. An angle θ2 is formed between the contour 44 and the contour 40. An angle θ3 is formed between the contour 44 and the contour 42. The angles θ2, θ3 are angles that are larger than the acute angle θ1. More specifically, the angle θ2 is an obtuse angle, and the angle θ3 is a right angle.

If no edge filling portion 50 is present, the contour 40 and the contour 42 would be connected by the acute angle θ1. Contrary to this, in the present embodiment, the presence of the edge filling portion 50 allows the contours 40, 42, 44 to be connected by the angles θ2, θ3, which are larger than the acute angle θ1. As above, the edge filling portion 50 prevents a contour of the p-type contact region 18 from exhibiting a bend with the acute angle θ1.

As shown in FIG. 4, each stripe-patterned p-type contact region 20 has a width W2. Further, the corner portion 22b has a width W1 in the contact surface 15. That is, the width W1 is a width between the contour 40 and the outer peripheral edge of the anode electrode 14. A reference number 60 in FIG. 4 shows a straight line that bisects the acute angle θ1. A combined width Wc in FIG. 4 is a width of the p-type contact region 18 at a portion that includes the intersection P1 in a direction intersecting orthogonally to the straight line 60. The combined width Wc can be calculated by a formula of Wc=(W1+W2)/cos(θ/2). A width Wa in FIG. 4 is a width of the p-type contact region 18 at a portion that includes the edge filling portion 50 in the direction intersecting orthogonally to the straight line 60. The width Wa is wider than the combined width Wc. If no edge filling portion 50 is present, the combined width Wc would be a maximum width in the direction intersecting orthogonally to the straight line 60 at the connection. Contrary to this, in the present embodiment, the width of the p-type contact region 18 is widened by the edge filling portion 50 being provided.

A length W3 in FIG. 4 shows a length of the contour 44. Further, an interval W4 in FIG. 4 is an interval between the stripe-patterned p-type contact regions 20 adjacent to each other. The length W3 is smaller than a half of the interval W4.

Next, an operation of the SBD 10 will be described. When a forward voltage (that is, a voltage by which the anode electrode 14 comes to be at a higher potential than the cathode electrode 16) is applied to the SBD 10, electrons flow from the drift region 26 to the anode electrode 14 through a Schottky interface between the anode electrode 14 and the drift region 26. That is, the electrons flow from the cathode electrode 16 to the anode electrode 14 through the cathode region 28 and the drift region 26. Due to this, the SBD 10 turns on. Further, in the SBD 10, current does not flow in the p-type contact region 18. That is, the SBD 10 is a JBSD.

Thereafter, when a reverse voltage is applied to the SBD 10, the flow of the electrons stops, and the SBD 10 turns off. Further, when the SBD 10 turns off, a depletion layer spreads from the p-type contact region 18 to the drift region 26 located therearound. The drift region 26 exposed on the contact surface 15 is pinched off by the depletion layer. Due to this, a high voltage is prevented from being applied to the Schottky interface between the anode electrode 14 and the drift region 26.

Next, a manufacturing method of the SBD 10 will be described. The SBD 10 is manufactured from a semiconductor substrate having a substantially same n-type impurity concentration as the drift region 26. Firstly, a mask having openings with same shapes as planar shapes of the p-type contact region 18 and the FLRs 24 as aforementioned is formed on a surface of the semiconductor substrate. A first opening corresponding to the ring-shaped p-type contact region 22 constitutes a closed loop on the semiconductor substrate, and has corner portions extending in a curved shape. Second openings corresponding to the stripe-patterned p-type contact regions 20 are located on an inner peripheral side of the first opening, and are connected to the corner portions. Third openings corresponding to the edge filling portions 50 are formed at connections of the first opening and the second openings. Due to this, outer peripheral edges of openings corresponding to the contours 40, 42, 44 of FIG. 4 are formed to exhibit bends with the relatively large angles θ2, θ3. That is, the mask will not be formed with a portion having its outer peripheral edge exhibiting a bend with the acute angle θ1. Next, p-type impurities are implanted to the semiconductor substrate via the mask. Due to this, the p-type contact region 18 and the FLRs 24 are formed. An n-type region (that is, the drift region 26) remains in each portion covered by the mask. Next, the mask is removed from the surface of the semiconductor substrate. Then, the anode electrode 14 is formed on the surface of the semiconductor substrate. The anode electrode 14 is formed, as shown in FIGS. 2 to 4, such that it makes contact with the stripe-patterned p-type contact regions 20, the ring-shaped p-type contact region 22, and the edge filling portions 50 but does not make contact with the FLRs 24. Further, the anode electrode 14 is formed to be in contact with the drift region 26 at positions where the stripe-patterned p-type contact regions 20, the ring-shaped p-type contact region 22, and the edge filling portion 50 are not formed. The anode electrode 14 is formed to be in Schottky contact with the p-type contact region 18 and the drift region 26. Then, the SBD 10 is completed after having formed a structure on a lower surface 12b side (that is, the cathode region 28 and the cathode electrode 16).

If the SBD does not include the edge filling portions 50, the outer peripheral edges of the mask must be formed to exhibit bends with the angle of acute angle θ1 in the aforementioned manufacturing process. At the portions that bend with the acute angle θ1 as such, the mask cannot be formed with high precision. Further, even if the mask is made with such high precision, it is difficult to form a pattern corresponding to the acute angle θ1 in the semiconductor substrate, since the p-type impurities are to be dispersed within the semiconductor substrate. As a result, the connections connecting the stripe-patterned p-type contact regions 20 and the corner portions 22b with the acute angle θ1 cannot stably be formed. Due to this, differences in electric properties among mass-produced SBDs become large, if the edge filling portions 50 are not present. Further, since the portions of the mask that exhibit the bends with the acute angle θ1 have a narrow width, they may be detached from the semiconductor substrate during the manufacturing process. As a result, the detached portions of the mask become particles, which may cause undesirable defects in the manufacturing process.

In regards to this, the SBD 10 of the present embodiment is provided with the edge filling portions 50, so the contour of the p-type contact region 18 is prevented from exhibiting a bend with the acute angle θ1 at each of the connections of the stripe-patterned p-type contact regions 20 and the corner portions 22b. Since the contour of the p-type contact region 18 exhibits bends with the angles θ2, θ3, which are larger than the acute angle θ1, the connections can be formed with high precision. Due to this, the differences in the electric properties are less likely to occur among the SBDs, in mass production of the SBDs 10 of the present embodiment. Further, since the mask will also be free of the portions exhibiting the bends with the acute angle θ1, parts of the mask are less likely to be detached from the semiconductor substrate. Due to this, the SBDs 10 can be manufactured with high yield.

Further, as aforementioned, electrons flow from the drift region 26 to the anode electrode 14 in the SBD 10. Thus, regions in the contact surface 15 where the drift region 26 is exposed are regions where primary current flows. The SBD 10 of the embodiment has the length W3 in FIG. 4, which is equal to or less than the half of the interval W4. With a longer length W3, an area of each of the p-type edge filling portions 50 becomes larger. In the SBD 10 of the embodiment, the length W3 is set to equal to or less than ½ of the interval W4 to minimize the area of each edge filling portion 50, and an area of the drift region 26 in the contact surface 15 is thereby secured. Due to this, the regions where the primary current flows are sufficiently ensured.

Figure 5:
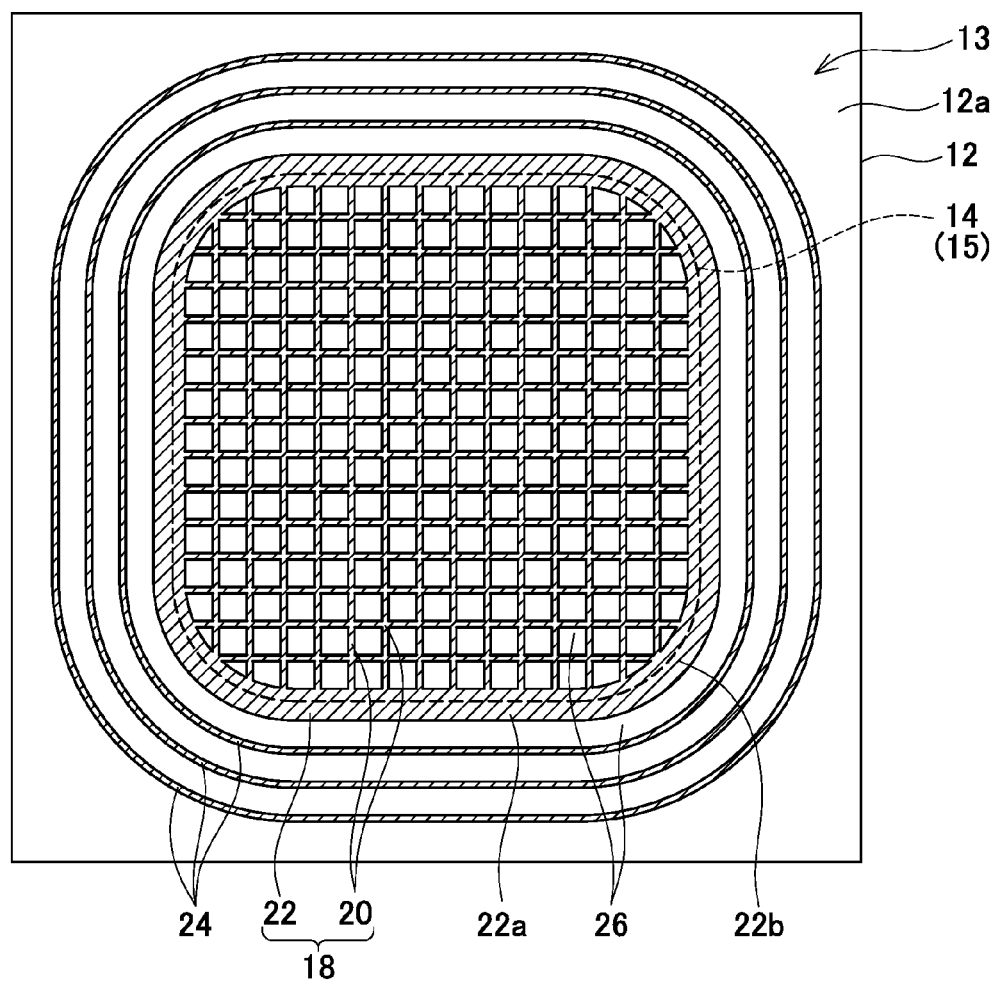
FIG. 5 is a top view of a semiconductor substrate 12 in a first variation.

Notably, in the above embodiment, the stripe-patterned p-type contact regions 20 are provided on the inner peripheral side of the ring-shaped p-type contact region 22. However, as shown in FIG. 5, a lattice-patterned p-type contact region may be provided on the inner peripheral side of the ring-shaped p-type contact region 22. Further, p-type contact regions with other shape patterns may be provided. That is, the p-type contact region provided on the inner peripheral side of the ring-shaped p-type contact region 22 may have any shape, so long as it is connected to one corner portion 22b.

Figure 6:
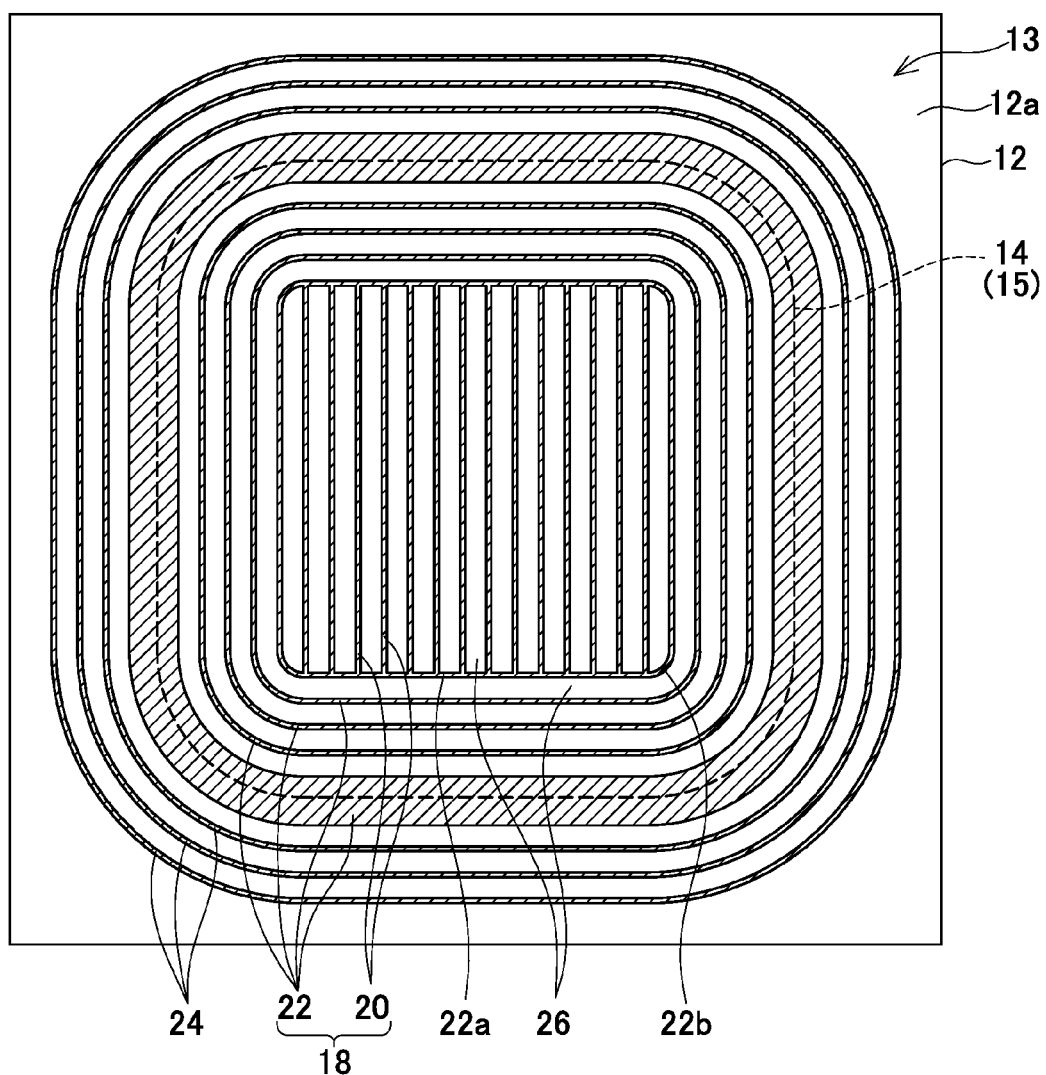
FIG. 6 is a top view of a semiconductor substrate 12 in a second variation.

Further, in the above embodiment, one ring-shaped p-type contact region 22 is provided in the contact surface 15. However, as shown in FIG. 6, a plurality of ring-shaped p-type contact regions 22 may be provided in the contact surface 15. It should be noted that, similar to FIG. 1, the number of the stripe-patterned p-type contact regions 20 is indicated in a smaller number than their actual number in FIG. 6 as well. In actual implementation, the plurality of stripe-patterned p-type contact regions 20 is connected to the corner portions 22b of the ring-shaped p-type contact region 22 on an innermost peripheral side. It should be noted that, in FIG. 6, an entirety of the ring-shaped p-type contact region 22 on the innermost peripheral side is located in the contact surface 15. Thus, the width W1 of the corner portions is equal to the width of the actual corner portions of the ring-shaped p-type contact region 22 on an innermost peripheral side.

Figure 7:
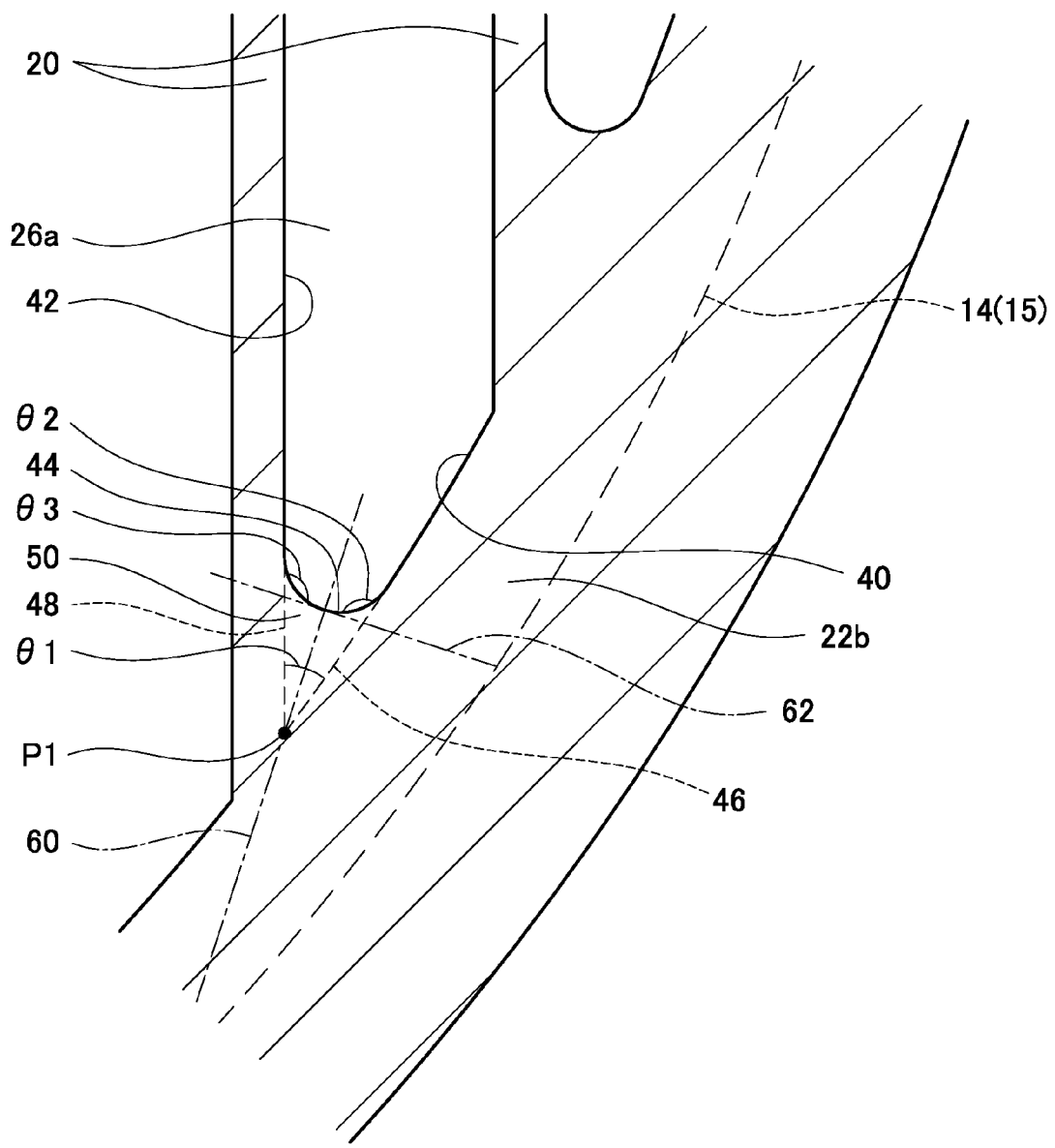
FIG. 7 is an enlarged view of a corner portion 22b in a third variation.

Further, in the aforementioned embodiment, the contours 44 of the edge filling portions 50 are straight lines, however, as shown in FIG. 7, each contour 44 may be a curved line (for example, an arc). In this case, an angle between the contour 40 and a straight line 62 intersecting orthogonally to the aforementioned straight line 60 becomes the aforementioned angle θ2, and an angle between the contour 42 and the straight line 62 becomes the aforementioned angle θ3.

It should be noted that, in the aforementioned embodiment, the angle θ2 is an obtuse angle and the angle θ3 is a right angle. However, the angles θ2, θ3 may be acute angles, so long as they are larger than the acute angle θ1. However, as in the embodiment, it is preferable that the angle θ2 and the angle θ3 are equal to or more than 90 degrees.

Further, the JBSD is described in the above embodiment, however, a similar structure may be employed in an MPSD. Further, in the above embodiment, the p-type contact region 18 is in Schottky contact with the anode electrode 14, however, they may be in ohmic contact.

Relationships between the constituent elements of the above embodiment and the constituent elements of the claims will be described. The ring-shaped p-type contact region 22 of the embodiment is an example of a first p-type region of the claims. The stripe-patterned p-type contact region 20 of the embodiment is an example of a second p-type region of the claims. The contour 40 of the embodiment is an example of a "the contour of the first p-type region extending in a range not being in contact with the edge filling portion" of the claims. The contour 42 of the embodiment is an example of a "the contour of the second p-type region extending in a range not being in contact with the edge filling portion" of the claims. The contour 44 of the embodiment is an example of a "a contour of each edge filling portion between a position at which the first p-type region extends away from the edge filling portion and a position at which the corresponding second p-type region extends away from the edge filling portion" of the claims. The extended line 46 of the embodiment is an example of a first extended line of the claims. The extended line 48 of the embodiment is an example of a second extended line of the claims.

Technical elements disclosed herein are listed hereinbelow. Notably, each of the technical elements as below is solely by itself useful.

In one configuration example disclosed herein, the second p-type region may extend in a strip-like shape within the contact surface. The acute angle is θ. A width of the corner portion within the contact surface is W1. A width of the second p-type region within the contact surface is W2. A width of the p-type contact region at the edge filling portion within the contact surface may be wider than a combined width Wc of the first p-type region and the second p-type region. $Wc=(W1+W2)/\cos(\theta/2)$ is satisfied.

In another configuration example disclosed herein, an angle formed by the first p-type region and the edge filling portion may be equal to or more than 90 degrees. An angle formed by the second p-type region and the edge filling portion may be equal to or more than 90 degrees.

In still another configuration example disclosed herein, the p-type contact region may comprise a plurality of the second p-type regions extending in parallel. A contour of each edge filling portion between a position at which the first p-type region extends away from the edge filling portion and a position at which the corresponding second p-type region extends away from the edge filling portion may be orthogonal to the corresponding second p-type region. A length of the contour of each edge filling portion may be equal to or less than a half of an interval between the second p-type regions adjacent to each other.

In still another configuration example disclosed herein, a length of a third contour is equal to or less than a maximum width of the n-type drift region between each corner portion and the second p-type region.

Specific examples of the present invention have been described in detail, however, these are mere exemplary indications and thus do not limit the scope of the claims. The art described in the claims includes modifications and variations of the specific examples presented above.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

REFERENCE SIGNS LIST

10: SBD
12: Semiconductor Substrate
14: Anode Electrode
16: Cathode Electrode
18: P-type Contact Region
20: Stripe-patterned P-type Contact Region
22: Ring-shaped P-type Contact Region
22a: Linear Portion
22b: Corner Portion
26: Drift Region
28: Cathode Region
30: Insulating Film
50: Chamfered Portion

The invention claimed is:

1. A Schottky barrier diode, comprising: a semiconductor substrate; and an anode electrode being in contact with a surface of the semiconductor substrate, wherein the semiconductor substrate comprises: a p-type contact region being in contact with the anode electrode; and an n-type drift region being in Schottky contact with the anode electrode, the p-type contact region comprises: a first p-type region constituting a closed loop at a contact surface between the anode electrode and the semiconductor substrate and including a corner portion having a curved shape; a second p-type region located on an inner peripheral side of the first p-type region at the contact surface and connected to the corner portion; and an edge filling portion being in contact with the first p-type region and the second p-type region at a connection between the first p-type region and the second p-type region, a first extended line and a second extended line intersect at an acute angle, where the first extended line is a line extended from a contour of the first p-type region toward the connection, the contour of the first p-type region extends in a range not being in contact with the edge filling portion, the second extended line is a line extended from a contour of the second p-type region toward the connection, and the contour of the second p-type region extends in a range not being in contact with the edge filling portion, and an acute angle edge formed between the first extended line and the second extended line is filled with the edge filling portion, the second p-type region extends in a strip-like shape within the contact surface, the acute angle is 0, a width of the corner portion within the contact surface is W1, a width of the second p-type region within the contact surface is W2, a width of the p-type contact region at the edge filling portion within the contact surface is wider than a combined width We of the first p-type region and the second p-type region, and $Wc=(W1+W2)/\cos(0/2)$ is satisfied.

2. The Schottky barrier diode of claim 1, wherein an angle formed by the first p-type region and the edge filling portion is equal to or more than 90 degrees, and an angle formed by the second p-type region and the edge filling portion is equal to or more than 90 degrees.

3. The Schottky barrier diode of claim 1, wherein the p-type contact region comprises a plurality of the second p-type regions extending in parallel, a contour of each edge filling portion between a position at which the first p-type region extends away from the edge filling portion and a position at which the corresponding second p-type region extends away from the edge filling portion is orthogonal to the corresponding second p-type region, and a length of the contour of each edge filling portion is equal to or less than a half of an interval between the second p-type regions adjacent to each other.

4. A method of manufacturing a Schottky barrier diode, the method comprising: forming a mask on a surface of an n-type semiconductor substrate, the mask including an opening, and the opening including features that: (a) the opening includes a first opening, a second opening, and a third opening, the first opening constitutes a closed loop and includes a corner portion having a curved shape, the second opening is located on an inner peripheral side of the first opening and connected to the corner portion, and the third opening is formed at a connection between the first opening and the second opening; (b) a first extended line and a second extended line intersect at an acute angle, where the first extended line is a line extended from a contour of the first opening toward the connection, the contour of the first opening extends in a range not being in contact with the third opening, the second extended line is a line extended from a contour of the second opening toward the connection, and the contour of the second opening extends in a range not being in contact with the third opening; and (c) the third opening is formed in a range including an acute angle edge formed between the first extended line and the second extended line; forming a p-type contact region in the semiconductor substrate by implanting p-type impurities to the semiconductor substrate via the mask; removing the mask from the surface; and forming an anode electrode on the surface, the anode electrode being in contact with the p-type contact region and in Schottky contact with an n-type region in a range which was covered with the mask, wherein the second opening extends in a strip-like shape within the surface, the acute angle is θ, a width of the corner portion within the surface is Wi, a width of the second opening within the surface is W2, a width of the opening at the third opening within the surface is wider than a combined width Wc of the first opening and the second opening, and Wc= (W1+W2)/cos(θ/2) is satisfied.

* * * * *